US008169815B2

(12) United States Patent
Javerliac et al.

(10) Patent No.: US 8,169,815 B2
(45) Date of Patent: May 1, 2012

(54) SYSTEM AND METHOD FOR WRITING DATA TO MAGNETORESISTIVE RANDOM ACCESS MEMORY CELLS

(75) Inventors: Virgile Javerliac, Sunnyvale, CA (US); Neal Berger, Cupertino, CA (US)

(73) Assignee: Crocus Technology S.A., Grenoble Cedex (FR)

( * ) Notice: Subject to any disclaimer, the term of this patent is extended or adjusted under 35 U.S.C. 154(b) by 263 days.

(21) Appl. No.: 12/418,747

(22) Filed: Apr. 6, 2009

(65) Prior Publication Data
US 2009/0251957 A1 Oct. 8, 2009

Related U.S. Application Data

(60) Provisional application No. 61/043,038, filed on Apr. 7, 2008.

(51) Int. Cl.
*G11C 11/00* (2006.01)
(52) U.S. Cl. ........................ 365/158; 365/171; 365/173
(58) Field of Classification Search .................. 365/158, 365/171, 173, 63
See application file for complete search history.

(56) References Cited

U.S. PATENT DOCUMENTS

| 6,191,973 | B1 | 2/2001 | Moyer |
| 6,269,016 | B1 | 7/2001 | Moyer |
| 6,304,477 | B1 | 10/2001 | Naji |
| 6,317,349 | B1 | 11/2001 | Wong |
| 6,385,082 | B1 | 5/2002 | Abraham et al. |
| 6,532,164 | B2 | 3/2003 | Redon et al. |
| 6,535,416 | B1 | 3/2003 | Daughton et al. |
| 6,603,677 | B2 | 8/2003 | Redon et al. |
| 6,693,822 | B2 | 2/2004 | Ito |
| 6,724,674 | B2 | 4/2004 | Abraham et al. |
| 6,950,335 | B2 | 9/2005 | Dieny et al. |
| 6,954,375 | B2 | 10/2005 | Ohmori |
| 6,963,098 | B2 | 11/2005 | Daughton et al. |
| 7,012,832 | B1 | 3/2006 | Sin et al. |
| 7,129,555 | B2 | 10/2006 | Nozieres et al. |
| 7,310,265 | B2 | 12/2007 | Zheng et al. |
| 7,518,897 | B2 | 4/2009 | Nozieres et al. |

(Continued)

FOREIGN PATENT DOCUMENTS
EP            1 225 593 A1     7/2002
(Continued)

OTHER PUBLICATIONS
US, Notice of Allowance and Fees Due, Jan. 2, 2009.
(Continued)

*Primary Examiner* — Richard Elms
*Assistant Examiner* — Hien Nguyen
(74) *Attorney, Agent, or Firm* — Pearne & Gordon LLP

(57) ABSTRACT

Magnetic random access memory (MRAM) cell with a thermally assisted switching writing procedure and methods for manufacturing and using same. The MRAM cell includes a magnetic tunnel junction that has at least a first magnetic layer, a second magnetic layer, and an insulating layer disposed between the first and a second magnetic layers. The MRAM cell further includes a select transistor and a current line electrically connected to the junction. The current line advantageously can support a plurality of MRAM operational functions. The current line can fulfill a first function for passing a first portion of current for heating the junction and a second function for passing a second portion of current in order to switch the magnetization of the first magnetic layer.

12 Claims, 3 Drawing Sheets

U.S. PATENT DOCUMENTS

| | | | |
|---|---|---|---|
| 2002/0057593 A1 | 5/2002 | Hidaka | |
| 2003/0012063 A1 | 1/2003 | Chien | |
| 2004/0095801 A1 | 5/2004 | Stipe | |
| 2004/0160809 A1 | 8/2004 | Lin et al. | |
| 2005/0195658 A1 | 9/2005 | Sousa et al. | |
| 2006/0291276 A1 | 12/2006 | Nozieres et al. | |
| 2007/0189064 A1* | 8/2007 | Min et al. | 365/158 |
| 2007/0258284 A1* | 11/2007 | Ho et al. | 365/171 |
| 2008/0084724 A1* | 4/2008 | Nozieres et al. | 365/50 |

FOREIGN PATENT DOCUMENTS

| | | |
|---|---|---|
| EP | 1 321 943 A | 6/2003 |
| EP | 1 507 266 A | 2/2005 |
| EP | 1 580 748 A | 9/2005 |
| EP | 2 109 111 A1 | 10/2009 |
| FR | 2 817 998 A1 | 6/2002 |
| FR | 2 817 999 A1 | 6/2002 |
| FR | 2 829 867 A1 | 3/2003 |
| FR | 2 829 868 A1 | 3/2003 |
| FR | 2 832 542 A1 | 5/2003 |
| WO | WO 03/025942 A2 | 3/2003 |
| WO | WO 03/025946 A1 | 3/2003 |
| WO | WO 03/043017 A2 | 5/2003 |
| WO | WO 2005/036559 A1 | 4/2005 |
| WO | WO 2005/086171 A1 | 9/2005 |
| WO | WO 2008/010957 A2 | 1/2008 |
| WO | WO 2008/040561 A3 | 4/2008 |

OTHER PUBLICATIONS

WO, International Search Report, Apr. 10, 2008.
EP Search Report, Application No. 09157306.3-2210, Aug. 25, 2009.
US, Notice of Allowance, U.S. Appl. No. 12/348,830, Oct. 19, 2009.
US, Office Action, U.S. Appl. No. 12/422,752, Oct. 20, 2009.
EP Examination Report, Application No. 07 818 777.0-2210, Aug. 4, 2009.
Purnama, Budi, et al., "Micromagnetic Simulation of Thermally Assisted Magnetization Reversal in Magnetic Nanodots with Perpendicular Anisotropy," Journal of Magnetism and Magnetic Materials, 310 (2007) pp. 2683-2685.

* cited by examiner

SYSTEM AND METHOD FOR WRITING DATA TO MAGNETORESISTIVE RANDOM ACCESS MEMORY CELLS

CROSS-REFERENCE TO RELATED APPLICATIONS

This application claims priority to U.S. provisional patent application, Ser. No. 61/043,038, filed on Apr. 7, 2008. Priority to the provisional application is expressly claimed, and the disclosure of which is hereby incorporated herein by reference in its entirety and for all purposes.

The subject matter of the present application relates to a U.S. nonprovisional patent application Ser. No. 11/869,632, filed on Oct. 9, 2007, the disclosure of which is hereby expressly incorporated herein by reference in its entirety and for all purposes.

FIELD

The present disclosure relates generally to random access memory and more particularly, but not exclusively, to magnetic tunnel junction-based memory cells.

BACKGROUND

Magnetic random access memory (MRAM) cells have been an object of renewed interest with the discovery of magnetic tunnel junctions (MTJs), having a strong magnetoresistance at ambient temperature. These MRAM cells present many advantages such as speed (a few nanoseconds of duration of writing and reading), non-volatility, and insensitivity to ionizing radiations. Consequently, MRAM cells are increasingly replacing memory that uses more conventional memory cell technology based on the charge state of a capacitor (DRAM, SRAM, FLASH).

Thermally-assisted switching magnetic tunnel junction (TAS-MTJ)-based MRAM cells have been described in U.S. Pat. No. 6,950,335 B2 and United States Patent Application Publication No. US 2006/0291276 A1. These typical implementations use a first dedicated line for the magnetic field generation and a second, separate dedicated line for heating the cell junction or reading the cell state.

FIG. 1a shows a first implementation of a conventional TAS-MTJ based MRAM cell 1. As illustrated in FIG. 1, the cell 1 comprises a junction 2 placed between a selection CMOS transistor 3 and a bit line 4, represented parallel to the page. Also orthogonal with the bit line 4, a field (or writing) line 5 is placed underneath the magnetic tunnel junction 2. This configuration includes a strap 7 between the bottom of the magnetic tunnel junction 2 and the selection transistor 3. More particularly, the field line 5 uses an M2 CMOS metal level, and two M1 metal lines are used to contact select transistor source/drain (S/D) nodes. The bit line 4 is at an M3 CMOS level. The cell configuration of FIG. 1a requires, at the M2 level, a minimum spacing d between the field line 5 and the cell strap 7, increasing the size of the cell 1. Using the bottom part of the magnetic tunnel junction 2 as a strap 7 can further increase the distance between two adjacent cells 1, due to a minimum spacing requirement between adjacent straps 7.

The writing procedure of the TAS-MTJ based MRAM cell 1 is performed by heating the magnetic tunnel junction 2 with a heating current 31 that passes through the magnetic tunnel junction 2 via the bit line 4. This is achieved when the transistor 3 is in a conducting mode (ON). Simultaneously (or after a short time delay) and once the magnetic tunnel junction 2 has reached a suitable temperature threshold, a field current 41 is passed through the field line 5, producing a magnetic field 42 capable of addressing the magnetic tunnel junction 2 by switching the magnetization of a soft magnetic layer, or storage layer (not shown), into the appropriate direction. The heating current 31 then is turned off by setting the selection transistor 3 in a cutoff mode (OFF) or by removing the transistor's source-drain bias. The field current 41 is maintained during the cooling of the magnetic tunnel junction 2. The field current 41 is switched off when the magnetic tunnel junction 2 has reached a predetermined temperature, wherein the magnetization of the storage layer is frozen in the written state.

FIG. 1b shows an alternative configuration of the conventional TAS-MTJ based MRAM cell 1, wherein the field line 5 is placed above the magnetic cell 1. In the configuration of FIG. 1b, the field line 5 uses an M3 CMOS metal level. The bit line 4 is disposed at an M2 CMOS level with the magnetic tunnel junction 2 being placed between the M1 and M2 levels. This configuration allows for an increased density, or a reduced cell size, since the strap 7 of configuration of FIG. 1a is not required and since the cell 1 can be stacked on the transistor 3. The procedure for writing to the cell 1 of FIG. 1b is similar to the procedure for writing to the cell 1 of FIG. 1a. However, the larger distance h between the M3 level and the magnetic tunnel junction 2 requires the use of a field current 41 to write the cell 1 of FIG. 1b that is typically at least double the field current 41 used to write the cell 1 of FIG. 1a. Both cell configurations of FIG. 1a and FIG. 1b also require at least three CMOS metal levels.

Accordingly, there is a need for a TAS-MTJ based MRAM cell having lower power consumption and for memory devices comprising an array of TAS-MTJ based MRAM cells with higher cell density and lower cost of fabrication.

SUMMARY

The above limitations of prior art magnetic random access memory (MRAM) cells can be overcome by a MRAM cell with a thermally assisted switching writing procedure. The MRAM cell comprises a magnetic tunnel junction. The magnetic tunnel junction includes at least a first magnetic layer, a second magnetic layer, and an insulating layer that is disposed between the first and a second magnetic layers. The MRAM cell further includes a select transistor and a current line electrically connected to the junction. The current line advantageously can support several MRAM operational functions. The current line can fulfill a first function for passing a first portion of current for heating the junction and a second function for passing a second portion of current in order to switch the magnetization of the first magnetic layer.

In one embodiment, the second portion of current can be a field current for generating a magnetic field capable of switching the magnetization of the first magnetic layer.

In another embodiment, the second portion of current can be a spin polarized write current for inducing magnetic switching of the first magnetic layer.

One exemplary method of writing data in the magnetic memory cell can comprise one or more of:

a) passing the first portion of current through the junction via the current line in order to heat the junction;

b) passing the second portion of current through the current line in order to switch the magnetization of the storage layer;

c) after the junction has reached a suitable high temperature threshold, turning off the first portion of current in order to cool the junction; and/or d) after the junction has cooled down to a low temperature threshold current, turning off the second portion of current.

In contrast with the MRAM cell configuration of the prior art, the MRAM cell can utilize two CMOS metal levels. The reduced number of CMOS metal levels advantageously can result in a lower manufacturing complexity and cost. Moreover, since the current line is disposed in close proximity to the junction of the MRAM cell, a larger ratio of magnetic field to field current is obtained, yielding a MRAM cell with low power consumption.

BRIEF DESCRIPTION OF THE DRAWINGS

The preferred embodiments will be better understood with the aid of the description of each embodiment given by way of example and illustrated by the figures, in which.

Figure 1A:
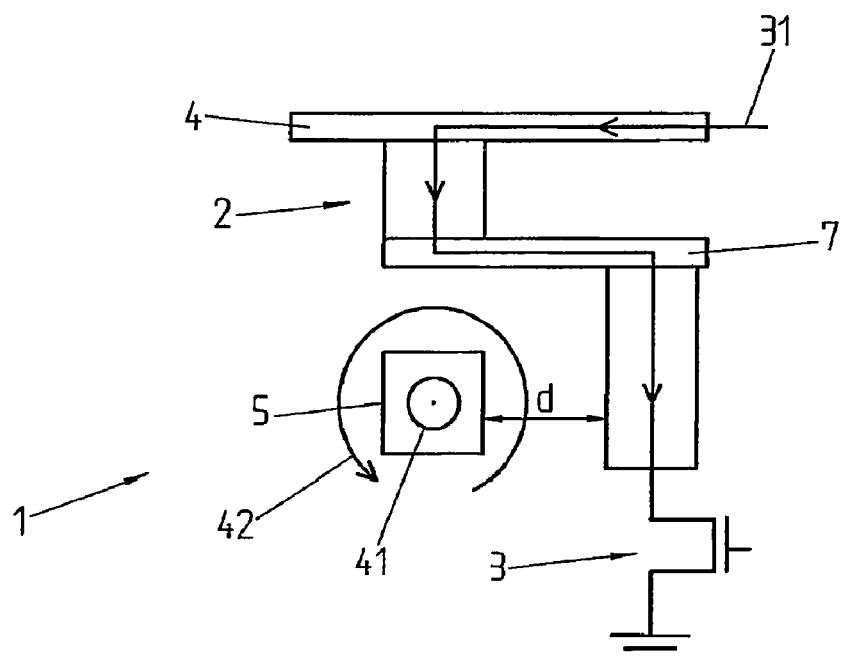
FIG. 1a illustrates a first configuration of a prior art thermally-assisted switching magnetic tunnel junction, magnetic random access memory (TAS-MTJ MRAM) cell.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the present disclosure and do not limit the scope of the disclosure.

DETAILED DESCRIPTION OF THE PREFERRED EMBODIMENTS

Figure 2:
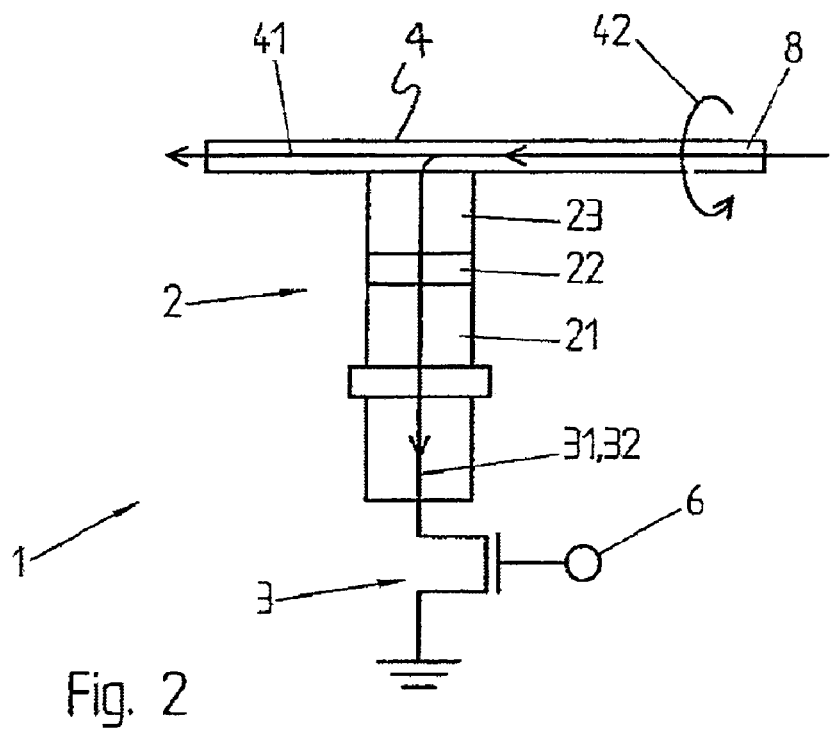
FIG. 2 illustrates one embodiment of a single-line, TAS-MTJ MRAM cell.

One embodiment of a single-line (SL), thermally-assisted switching (TAS) magnetic tunnel junction (MTJ)-based magnetic random access memory (MRAM) cell, called the SL-TAS cell 1 in the text below, is represented in FIG. 2. The SL-TAS cell 1 comprises a magnetic tunnel junction 2 with at least a first magnetic layer, a second magnetic layer, and an insulating layer 22. As shown in FIG. 2, the first magnetic layer can be provided as a magnetic storage layer 23; whereas, the second magnetic layer can be provided as a reference magnetic layer 21. The insulating layer 22 is illustrated as being inserted between the sense layer 21 and the storage layer 23.

The magnetic tunnel junction 2 can be disposed between a select transistor 3 on the side of the reference layer 21 and a current line 8. The current line 8 is shown as being electrically connected to the magnetic tunnel junction 2 on the side of the storage layer 23. A control current line, or word line 6, can be used to control the opening and the closing of the transistor 3 in order to address the SL-TAS cell 1 individually. The select transistor 3, for example, can comprise a CMOS transistor.

The current line 4 is represented as being parallel to the page in FIG. 2. The current line 4 advantageously can fulfill several MRAM operational functions. First, the current line 4 can fulfill a function of a bit line by passing a heating current 31. The current line 4 likewise can fulfill a function of a field line by passing a field current 41 to produce a magnetic field 42 capable of switching the magnetization of the storage layer 23 in the magnetic tunnel junction 2.

A magnetic memory device (not shown) can be formed by assembling an array comprising a plurality of the SL-TAS cells 1. The array of SL-TAS cells 1 can be disposed within a device package (not shown). When forming the magnetic memory device, the magnetic tunnel junction 2 of each SL-TAS cell 1 can be connected on the side of the storage layer 23 to the current line 8 and on the opposite side to the word line 6. The word line 6 preferably is placed perpendicularly with reference to the current line 8.

In one embodiment, the writing process of the SL-TAS cell 1 can be performed by heating the magnetic tunnel junction 2 with a first portion of current, here a heating current 31, passing through the magnetic tunnel junction 2. The heating of the magnetic tunnel junction 2 can be achieved when the transistor 3 is in the conducting mode (ON). When the magnetic tunnel junction 2 has reached a suitable temperature, a second portion of the current, here a field current 41, can be passed through the current line 8. The second portion of the current produces a magnetic field 42 capable of addressing the magnetic tunnel junction 2 by switching the magnetization of the storage layer 23 into the appropriate direction. The heating current 31 then can be turned off by setting the selection transistor 3 in the cutoff mode (OFF) and/or by removing the transistor's source-drain bias. The field current 41 can be maintained during the cooling of the magnetic tunnel junction 2, and then switched off, when the magnetic tunnel junction 2 has reached a temperature wherein the magnetization is frozen in the written state.

In another embodiment, the writing process of the SL-TAS cell 1 can be performed by switching the magnetization of the storage layer 23 using a spin polarized write current flowing through the current line 8 and the magnetic tunnel junction 2 when one of the selection transistors 3 in ON. One example of such a current induced magnetic switching-based writing operation combined with the TAS-assisted write procedure is described in the case of a MRAM-based memory in U.S. Pat. No. 6,950,335 B2, the disclosure of which is hereby incorporated by reference in its entirety and for all purposes. In this embodiment, a bias field can be generated by a passing a portion of the spin polarized write current through the current line 8 in order to minimize the magnitude of the spin polarized write current required for the magnetic switching of the storage layer 23.

During the reading procedure, the transistor 3 can switched ON, and a sense current 32 can be passed through the magnetic tunnel junction 2 via the current line 8. A voltage across the magnetic tunnel junction 2 thereby can be measured. The voltage measurement can yield a corresponding resistance R of the magnetic tunnel junction 2. If the magnetization orientation of the storage layer 23 imposed by the magnetic field 42 is parallel to the magnetization direction of the reference layer 21, the measured junction resistance R has a low resistance value. In contrast, if the first magnetization direction of the storage layer 23 is antiparallel to the magnetization direction of the reference layer 21, a high junction resistance R can be measured.

Alternatively, and/or additionally, the junction resistance R can be determined by applying a voltage bias across the magnetic tunnel junction 2 and measuring the corresponding current flowing through the magnetic tunnel junction 2.

Exemplary heating current 31 and field current pulse sequences are illustrated in FIGS. 3a-3d, wherein the total current $I_{bl}$ passing through the current line 8 is plotted against time t. More particularly, in each of FIGS. 3a-3d, Graph (b) shows an exemplary pulse sequence of the heating current 31; whereas, Graph (a) shows a sum of the pulse sequences of the heating current 31 and field current 41. The upper graph of Graph (a) illustrates the corresponding write time (WRT) sequence.

Figure 3A:
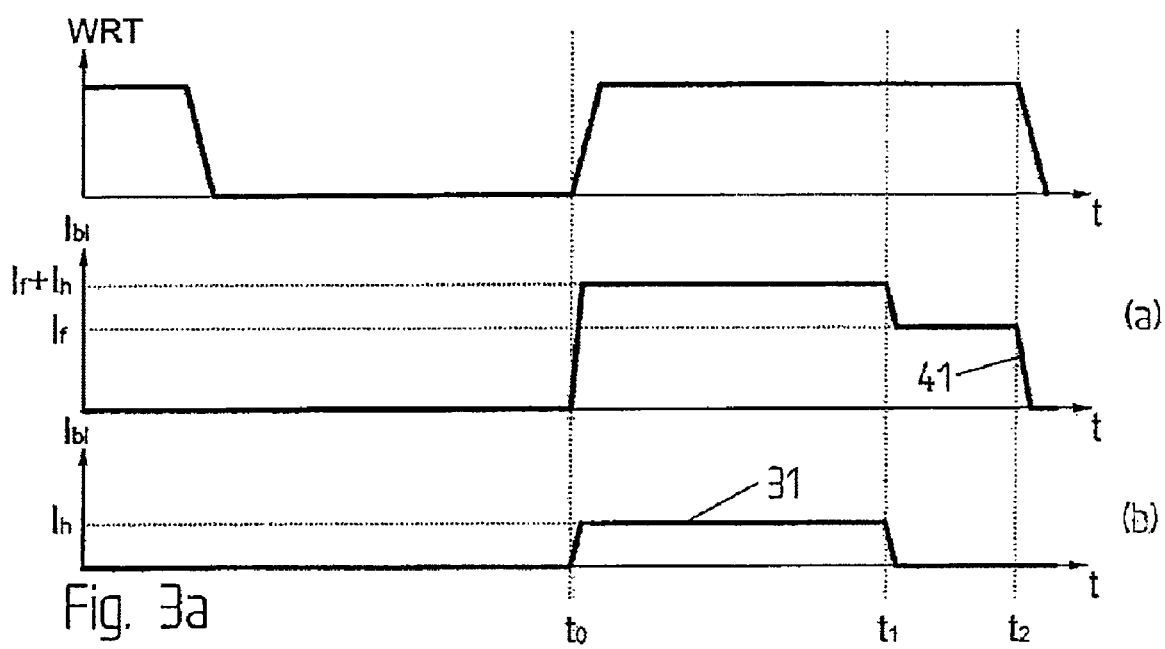
FIGS. 3a-3d respectively illustrate alternative embodiments of pulse sequences for field and heating current passing in the single-line, TAS-MTJ MRAM cell.

Turning to FIG. 3a, the heating current 31 can be passed through the magnetic tunnel junction 2 (shown in FIG. 2) via the current line 8 (shown in FIG. 2) and simultaneously with the field current 41. FIG. 3a shows that the field current 41 can have a magnitude of $I_f$ and that the heating current 31 can have a magnitude of $I_h$. The field current 41 and the heating current 31 are illustrated as being applied in the current line 8 at a time $t_0$. The heating current 31 is turned off at a time $t_1$ when the magnetic tunnel junction 2 has reached a suitable high temperature threshold. The field current 41 is maintained during the cooling of the magnetic tunnel junction 2 and then switched off at a time $t_2$. Here, the time interval between time $t_1$ and time $t_2$ comprises a predetermined amount of time for permitting the magnetic tunnel junction 2 to reach a low temperature threshold at which the magnetization of the storage layer is frozen in the state written by the field current 41. In the upper graph (a) of FIG. 3a, the superimposition of the heating current 31 over the field current 41, yielding a current magnitude of $I_{bi}=I_f+I_h$, is visible in the time interval between time $t_0$ and time $t_1$.

Figure 3B:
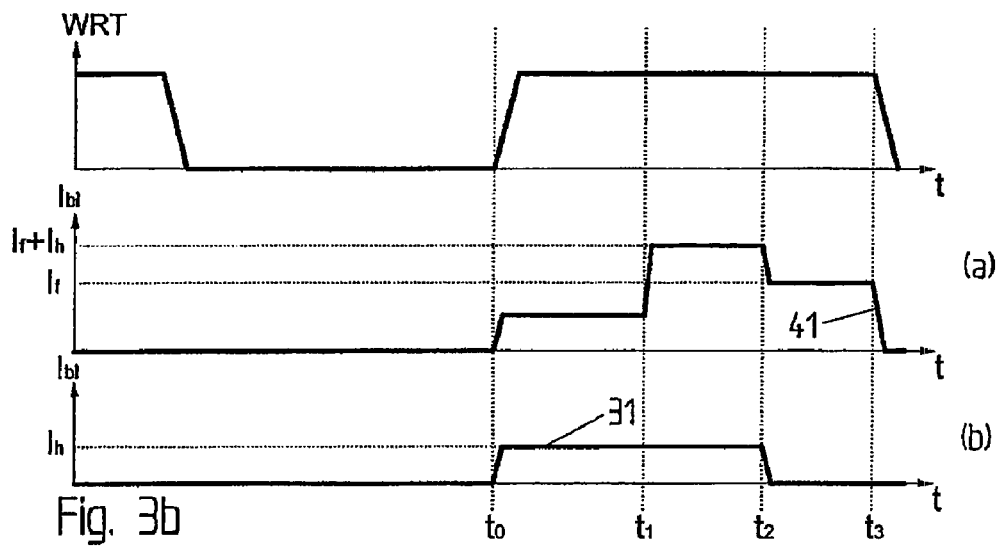

Another preferred embodiment is represented in FIG. 3b. Turning to FIG. 3b, the heating current 31 is shown as being first applied in the current line 8 (shown in FIG. 2) at time $t_0$ and the field current 41 subsequently can be applied in the same current line 8 at a time $t_1$ after junction 2 has sufficiently heated. The magnetization of the storage layer 23 thereby can be readily switched by the magnetic field generated by the field current 41. In the manner set forth above with reference to FIG. 3a, the field current preferably is maintained until a time $t_3$, wherein the magnetic tunnel junction 2 has reached the low temperature threshold. The field current then can be switched off such that the magnetization of the magnetic tunnel junction 2 is frozen in the written state. As illustrated in FIG. 3b, the heating current 31 can be maintained until a time $t_2$ that occurs prior to the time $t_3$ but after the time $t_1$.

Under certain circumstances, the pulse sequences of the field current 41 and the heating current 31 illustrated in FIG. 3a may be easier to implement than pulse sequences of the field current 41 and the heating current 31 shown in FIG. 3b because the synchronization of the field and heating currents pulse sequences of FIG. 3a can be simpler. The pulse sequences of FIG. 3b, however, advantageously yield lower average power consumption due to the shorter pulse duration of the field current 41.

Figure 3C:
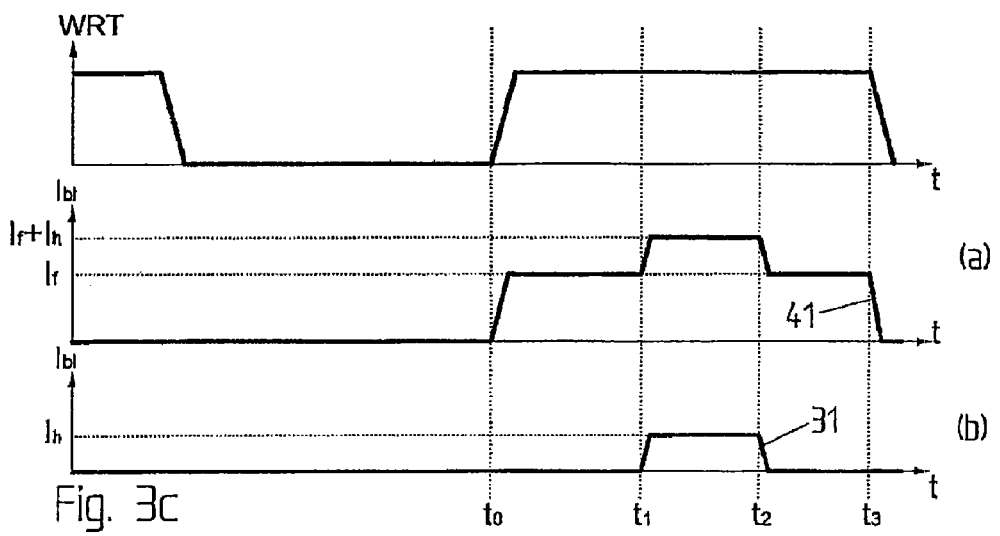

In another embodiment, the field current 41 can first be applied in the current line 8 (shown in FIG. 2) at time $t_0$ and the heating current 31 can be applied in the same current line 8 at a time $t_1$ as illustrated in FIG. 3c. The heating current 31 is shown as being turned off at a time $t_2$; whereas, the field current 41 can be turned off at a time $t_3$ when the magnetic tunnel junction 2 has reached a temperature such that the magnetization is frozen in the written state. Here, the magnetization of the storage layer 23 (shown in FIG. 2) is switched during the period of time between time $t_1$ and time $t_2$ when the magnetic tunnel junction 2 (shown in FIG. 2) is heated. The pulse sequence of FIG. 3c may exhibit higher average power consumption than the pulse sequences shown in FIGS. 3a and 3b due to possible power dissipation during the time period between time $t_0$ and time $t_1$ when the field current 41 is applied and the magnetic tunnel junction 2 is not yet heated.

Figure 3D:
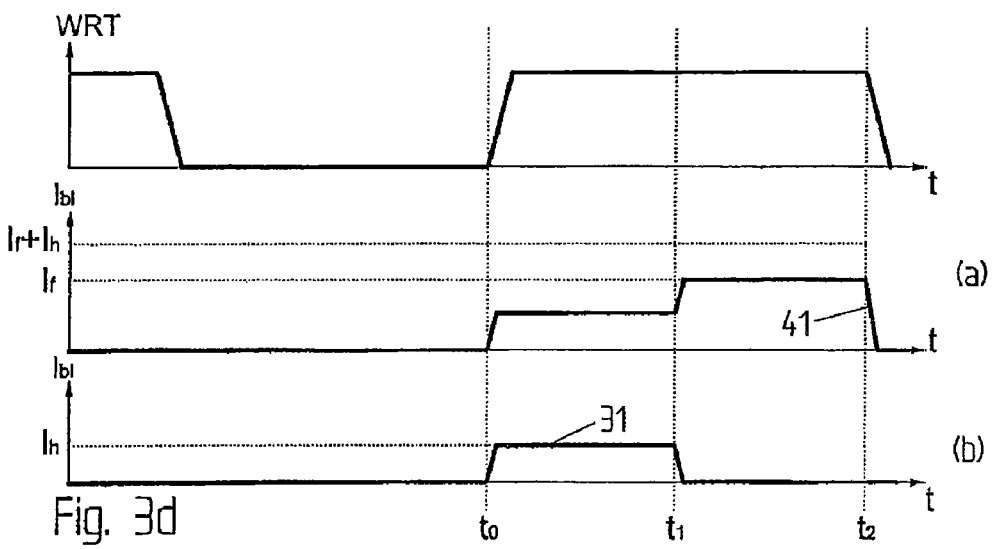

Yet another embodiment is represented in FIG. 3d. Turning to FIG. 3d, the heating current 31 is shown as being applied in the current line 8 (shown in FIG. 2) at time $t_0$. At time $t_1$, the magnetic tunnel junction 2 (shown in FIG. 2) is sufficiently heated, and heating current 31 can be switched off by turning the transistor 3 (shown in FIG. 2) OFF. The field current 41 likewise can be applied in current line 8 at time $t_1$, during the cooling of the magnetic tunnel junction 2, and then turned off at a time $t_2$. The pulse sequence shown in FIG. 3d can have possible critical timing constraints between the switching of the magnetization of the storage layer 23 (shown in FIG. 2) and timing of heating pulse 31. For example, the pulse sequence of FIG. 3d shows that the field current 41 is applied when the heating current 31 is turned off. The period of time when the magnetic tunnel junction 2 is heated enough for easy switching of the magnetization of the storage layer 23 can be short relative to the compared to the pulse sequences illustrated in FIGS. 3a to 3c.

Returning to FIG. 2, the heating current 31 flowing through the magnetic tunnel junction 2 can be effectively controlled to prevent over heating and/or under heating of the magnetic tunnel junction 2. The drain bias of the transistor 3 can vary along the current line 8, however, due to ohmic drop of the metal current line 8 having a finite resistance when the heating and/or field current 31, 41 are passed within the current line 8. Here, the heating current 31 can be controlled by management of the bias on the word line 6. For example, the heating current 31 can be controlled by operating the select transistor 3 in the conducting mode (ON), wherein the heating current 31 is essentially controlled by the voltage of the word line 6 and only secondarily by the drain bias of the transistor 3. Controlling heating current 31 in this manner likewise can safeguard against exposing the magnetic tunnel junction 2 to potentially harmful voltage potentials. Moreover, the resistance of the current line 8 can be used to limit and/or regulate the field current 41.

In order to keep the current flowing through transistor 3 relatively constant regardless of its physical array position along current line 8, it may be advantageous to periodically segment the current line 8, for example, in an array as defined above. This array segmentation may result in reduced array efficiency. The need for segmentation may be mitigated by decreasing the field current 41. The field current 41, for instance, can be decreased by cladding current line 8.

Figure 1B:
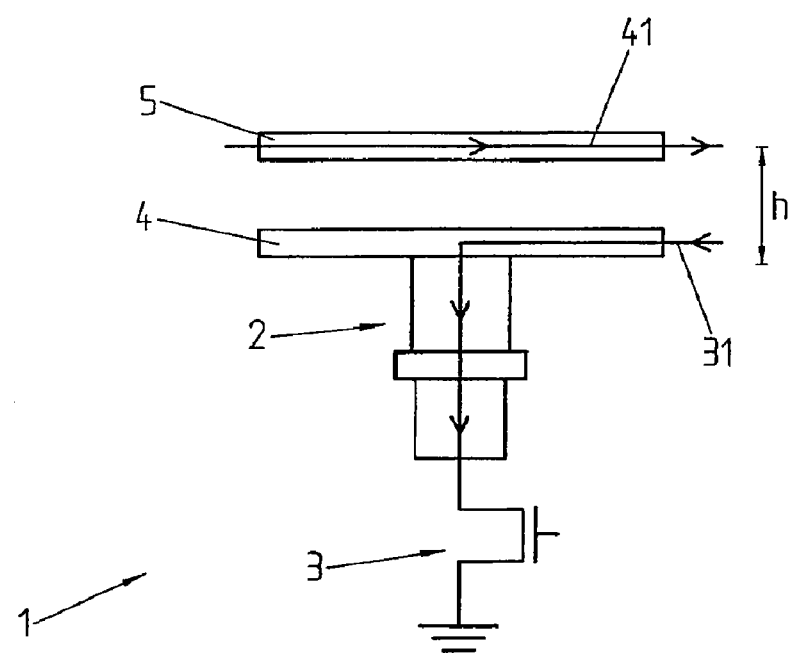
FIG. 1b illustrates a second configuration of a prior art thermally-assisted switching magnetic tunnel junction, magnetic random access memory (TAS-MTJ MRAM) cell.

The SL-TAS cell 1 advantageously allows for an effective cell size that is significantly reduced with respect with conventional cells due to the removal of the field line 5 (shown in FIGS. 1a-1b). The effective cell size likewise can be reduced because the SL-TAS cell 1 can be stacked, completely or partially, on the transistor 3 in the manner set forth in more detail above with reference to FIG. 1b. For example, in the case of a 130 nm technology, simple design layout shows a two-times decrease of effective cell size for a given field and heating currents 41, 31. Accordingly, the SL-TAS cell 1 can be easily downscaled, and magnetic memory devices having an increased cell density can be obtained.

In contrast with the cell configuration of prior art, the SL-TAS cell 1 as illustrated in FIG. 2 advantageously employs only two CMOS metal levels, M1 and M2. The smaller number of metal levels can result in reduced manufacturing complexity and cost by decreasing a number of masks steps to manufacture the SL-TAS cell 1.

Moreover, the field current 41 passing in the current line 8 generates a magnetic field 42 that is maximized relative to the magnetic field 42 generated by the cell configurations of FIGS. 1a and 1b. The increased strength of the magnetic field 42 is due at least in part to the proximity of the current line 8 to the storage layer 23 as shown in FIG. 2. The configuration of the SL-TAS cell 1 thereby advantageously enables use of a lower field current 41, decreases cell power consumption, and allows for larger ratio of magnetic field 42 to field current 41.

REFERENCE NUMBERS AND SYMBOLS

1 SL-TAS cell
2 magnetic tunnel junction
21 storage layer (first magnetic layer)
22 Insulating layer
23 reference layer (second magnetic layer)
3 select transistor
31 heating current (first portion of current)
32 sense current
4 bit line
41 field current (second portion of current)
42 magnetic field
5 field line
6 word line
7 strap
8 current line
d spacing between the field line and the cell strap
h distance between the field line and the junction
$I_{bl}$ total current passing in the current line
$I_f$ magnitude of field current
$I_h$ magnitude of heating current
R junction resistance
WRT write time The disclosed embodiments are susceptible to various modifications and alternative forms, and specific examples thereof have been shown by way of example in the drawings and are herein described in detail. It should be understood, however, that the disclosed embodiments are not to be limited to the particular forms or methods disclosed, but to the contrary, the disclosed embodiments are to cover all modifications, equivalents, and alternatives.

What is claimed is:

1. A method of writing data in a magnetic random access memory (MRAM) cell with a thermally assisted switching (TAS) writing procedure, the MRAM cell including a magnetic tunnel junction and a select transistor, the magnetic tunnel junction having a first magnetic layer, a second magnetic layer, and an insulating layer disposed between the first and second magnetic layers, the select transistor being coupled with the magnetic tunnel junction and controllable via a word line, a current line electrically connected to the magnetic tunnel junction and passing a first portion of current for heating the magnetic tunnel junction and a second portion of current for switching a magnetization of the first magnetic layer, the method comprising:
  passing the first portion of current through the magnetic tunnel junction via the current line to heat the magnetic tunnel junction;
  passing the second portion of current through the current line to switch the magnetization of the storage layer;
  after the magnetic tunnel junction has reached a predetermined high temperature threshold, turning off the first portion of current to cool the magnetic tunnel junction; and
  after the magnetic tunnel junction has cooled down to a predetermined low temperature threshold current, turning off the second portion of current.

2. The method according to claim 1, wherein said passing the second portion of current includes passing the second portion of current that comprises a field current for generating a magnetic field for switching the magnetization of the first magnetic layer.

3. The method according to claim 1, wherein said passing the second portion of current includes passing the second portion of current that comprises a spin polarized write current for inducing magnetic switching of the first magnetic layer.

4. The method according to claim 1, wherein said passing the first portion of current and said passing the second portion of current are performed simultaneously.

5. The method according to claim 1, wherein said passing the first portion of current is performed before said passing the second portion of current.

6. The method according to claim 5, wherein said passing the second portion of current and said turning off the first portion of current are performed simultaneously.

7. The method according to claim 1, wherein said passing the second portion of current is performed before said passing the first portion of current.

8. The method according to claim 1, wherein the first portion of current is controlled by the voltage of the word line when the select transistor is operated in a conducting mode.

9. The method according to claim 1, wherein the current line has a finite resistance, said resistance being used to limit or regulate the second portion of current.

10. A method of writing data in a magnetic random access memory (MRAM) cell with a thermally assisted switching (TAS) writing procedure, the MRAM cell including a magnetic tunnel junction and a select transistor, the magnetic tunnel junction having a first magnetic layer, a second magnetic layer, and an insulating layer disposed between the first and second magnetic layers, the select transistor being coupled with the magnetic tunnel junction and controllable via a word line, a current line electrically connected to the magnetic tunnel junction and passing a first portion of current for heating the magnetic tunnel junction and a second portion of current for switching a magnetization of the first magnetic layer, the method comprising:
  passing the first portion of current through the magnetic tunnel junction via the current line to heat the magnetic tunnel junction;
  passing the second portion of current through the current line to switch the magnetization of the storage layer;
  after the magnetic tunnel junction has reached a predetermined high temperature threshold, turning off the first portion of current to cool the magnetic tunnel junction; and
  after the magnetic tunnel junction has cooled down to a predetermined low temperature threshold current, turning off the second portion of current,
  wherein said passing the second portion of current is performed before said passing the first portion of current.

11. The method according to claim 10, wherein the first portion of current is controlled by the voltage of the word line when the select transistor is operated in a conducting mode.

12. The method according to claim 10, wherein the current line has a finite resistance, said resistance being used to limit or regulate the second portion of current.

* * * * *